(12) United States Patent
McCormick et al.

(10) Patent No.: US 7,061,116 B2
(45) Date of Patent: Jun. 13, 2006

(54) ARRANGEMENT OF VIAS IN A SUBSTRATE TO SUPPORT A BALL GRID ARRAY

(75) Inventors: Carolyn McCormick, Hillsboro, OR (US); Rebecca Jessep, Dallas, OR (US); John Dungan, Hillsboro, OR (US); David W. Boggs, Hillsboro, OR (US); Daryl Sato, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 617 days.

(21) Appl. No.: 09/962,254

(22) Filed: Sep. 26, 2001

(65) Prior Publication Data

US 2003/0057974 A1    Mar. 27, 2003

(51) Int. Cl.
*H01L 23/48*    (2006.01)
*H01L 23/52*    (2006.01)
*H01L 29/40*    (2006.01)

(52) U.S. Cl. .................................. 257/773
(58) Field of Classification Search ........... 257/773, 257/786; 438/125, 612
See application file for complete search history.

(56) References Cited

U.S. PATENT DOCUMENTS

| | | | |
|---|---|---|---|
| 5,010,038 A | 4/1991 | Fox et al. | |
| 5,216,278 A | 6/1993 | Lin et al. | |
| 5,293,067 A * | 3/1994 | Thompson et al. | 257/668 |
| 6,050,832 A | 4/2000 | Lee et al. | |
| 6,157,085 A | 12/2000 | Terashima | |
| 6,271,478 B1 * | 8/2001 | Horiuchi et al. | 174/255 |
| 6,282,782 B1 | 9/2001 | Biunno et al. | |

FOREIGN PATENT DOCUMENTS

EP    1 001 462 A2    5/2000

* cited by examiner

*Primary Examiner*—David A. Zarneke
(74) *Attorney, Agent, or Firm*—Michael D. Plimier

(57) ABSTRACT

An arrangement of pads with selective via in pad for mounting a semiconductor package on a substrate. In order to strengthen the soldered bonds, standard pads, which have a stronger bond, are used in locations of greatest stress and deflection. Vias in pad (VIP) are used at all other locations to improve routing advantages due to their smaller surface area.

3 Claims, 2 Drawing Sheets

ARRANGEMENT OF VIAS IN A SUBSTRATE TO SUPPORT A BALL GRID ARRAY

FIELD

The present invention relates generally to an arrangement of vias in a substrate to provide stronger bonds with a semiconductor package. More specifically, the present invention relates to an arrangement of standard vias and vias in pad for better support of a package having a ball grid array.

BACKGROUND

When semiconductor chip packages are applied to a substrate, it is convenient for the packages to be arranged on one side of the substrate and the wiring between the packages to be arranged on the other side. In order to accomplish this, it is necessary to utilize an arrangement known as a via. This consists of a hole through the substrate extending from one surface to the other. The walls of the hole are coated with an electrically conductive material, such as by plating. An electrically conductive pad is formed on each surface which is in electrical contact with the via. In standard vias, on the surface which receives the packages, the via pads are connected by a surface conductor to another pad which is nearby. This pad is used to receive a contact connected to the package. One common package contact is a ball grid array (BGA). Balls of solder are applied to the bottom of the package in a pattern which matches the contact pads on the substrate. Solder paste is applied to the contact pads and the assembly is heated to reflow the solder and to connect the package to the substrate.

While this arrangement is widely used, this arrangement with two pads and a surface conductor for each package contact uses a lot of surface area and makes routing of connections difficult. Another arrangement has been suggested whereby a single pad is used both as a via pad and a contact pad. This arrangement, known as via in pad (VIP), allows for easier routing on the substrate surface. However there have been manufacturing difficulties in that the solder balls often do not form a strong connection with the pad.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto. The spirit and scope of the present invention are limited only by the terms of the appended claims.

The following represents brief descriptions of the drawings, wherein.

DETAILED DESCRIPTION

Figure 1:
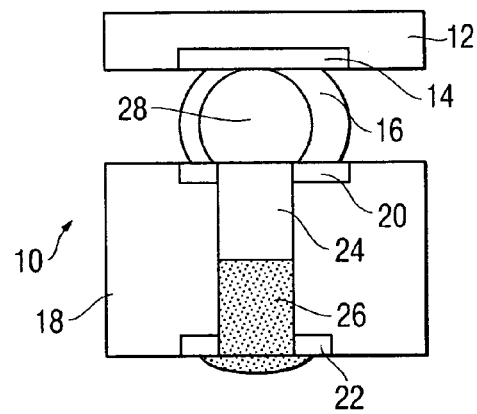
FIG. 1 is an example background arrangement useful in gaining a more thorough understanding/appreciation of the present invention.

Before beginning a detailed description of the subject invention, mention of the following is in order. When appropriate, like reference numerals and characters may be used to designate identical, corresponding or similar components in differing figure drawings. Further, in the detailed description to follow, example sizes/models/values/ranges may be given, although the present invention is not limited to the same.

In the VIP arrangement, a hole for the via is necessarily formed in the middle of the pad. This hole reduces the contact area between the solder ball of the BGA and the pad itself. This reduced contact area also reduces the strength of the bond between the ball and pad. Other problems also are involved with this connection. Since different materials are used in different parts of the unit, different thermal expansion coefficients cause the different parts to move unequally when the temperature changes. This can cause the bond to break or be weakened.

Further, the via hole is often filled with a material referred to as a plug. During the reflow process, the plug material is also heated and may be a source of outgassing. The gas given off by the plug may also interfere with the bond of the ball to the pad. Attempts have been made to reduce the outgassing. This includes replacing the plug with a much smaller cap which only covers the end of the via rather than filling it. However the removal of the plug sometimes allows the solder balls to be squashed, due to the weight of the package and heat sink. As result, the space between the package and the substrate is smaller than desired.

The use of standard vias avoids many of these problems since there is no hole in the via pad. The solder balls do not squash to the extent that the do with VIP pads. Also, there is no outgassing in the contact pad since the via is separated from it. However, as mentioned above, standard vias require more surface area and make routing of electrodes more difficult.

Attention is now directed to drawings and particularly to FIG. 1 in which a VIP arrangement 10 is shown. A semiconductor chip package 12 includes a contact pad 14, to which a solder ball 16 is attached. The substrate 18, to which the package is to be connected, includes a contact pad 20 to which the solder ball 16 is in contact. A pad 22 is provided on the opposite surface of the substrate. A via 24 extends between pads 20 and 22. The plug 26 is present in the lower part of the via.

When this arrangement is heated, outgassing sometimes occurs from plug 26 causing a gas bubble 28 to form in the center of the solder ball. During the reflow process, when the solder is heated, the bubble may prevent the solder from forming a tight connection. When the process works correctly, the solder flows into the via as for as the top of the plug with the remaining solder making a contact on top of pad 20. Gas bubbles may cause the melted solder not to fill the via completely and leave an uneven joint which may not be mechanically sound.

Figure 2:
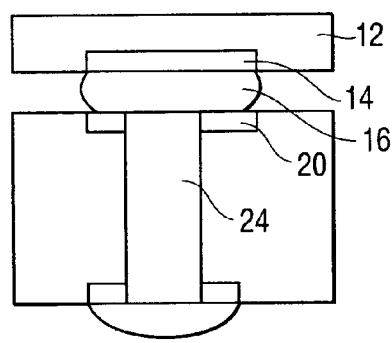
FIG. 2 is an example disadvantageous arrangement useful in gaining a more thorough understanding/appreciation of the present invention.

FIG. 2 shows another arrangement of a VIP, without a plug. One of the results is that the solder ball is squashed by the weight of the package reducing the spacing between the package and the substrate. When heated, the solder may actually drip causing additional problems.

Since the solder joints are subject to a number of mechanical stresses, it is important that they be mechanically strong. In addition to thermomechanical stresses, vibration caused by moving the unit can also be damaging. This not only includes movement during the manufacturing process, but also during packaging and transporting. Thus, the bond may be broken when the box in which the unit is carried is dropped when loading it onto a truck. If the bonds are not strong or the separation between the package and the substrate is not sufficient, open joints or short circuited joints may occur. The stresses which are applied are not uniform across the substrate. Highest stresses occur where the substrate deflects the largest amount. In order to withstand this deflection, the present invention utilizes stronger standard vias at the points in which deflection is most likely to occur.

Figure 3:
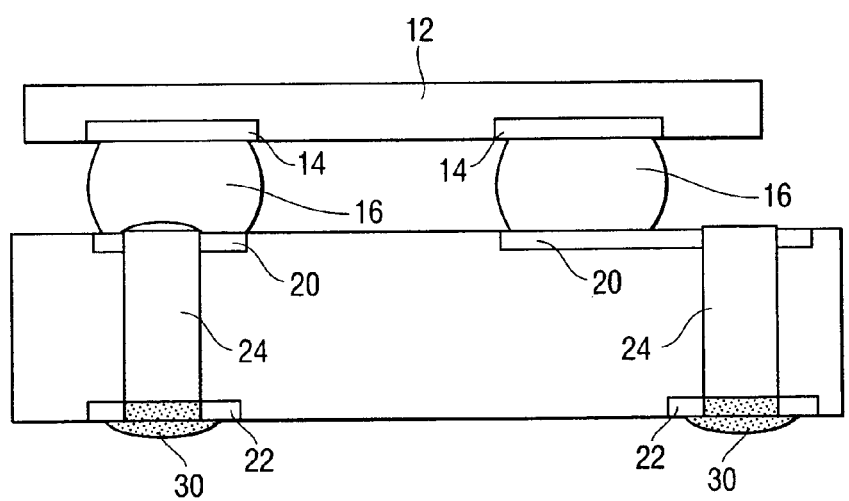
FIG. 3 is an example advantageous arrangement describing the present invention.

FIG. 3 shows an example embodiment of the present invention. In this Figure, two vias are shown. The via on the left shows a VIP arrangement, but with a cap 30 applied instead of a plug. The via on the right to shown in the standard arrangement where the joint is offset from the via. Since the joint is on a solid pad having no holes with no outgassing, it is more resistant to defects or stresses that occur in a VIP joint. Because this joint has a solid pad, it resists the loads presented in reflow because due to the weight of the package and heat sink, and also resists deflection caused by thermomechanical and other stresses when not molten.

The concept of the present invention is to utilize VIP pads where possible and to utilize standard pads for increased strength in the areas where stresses are greatest. For example, it is generally believed that the greatest problem areas are along the periphery of the package and especially at the corners. Thus, the present invention utilizes the standard arrangement in the problem areas and VIP pads in all others.

Figure 4:
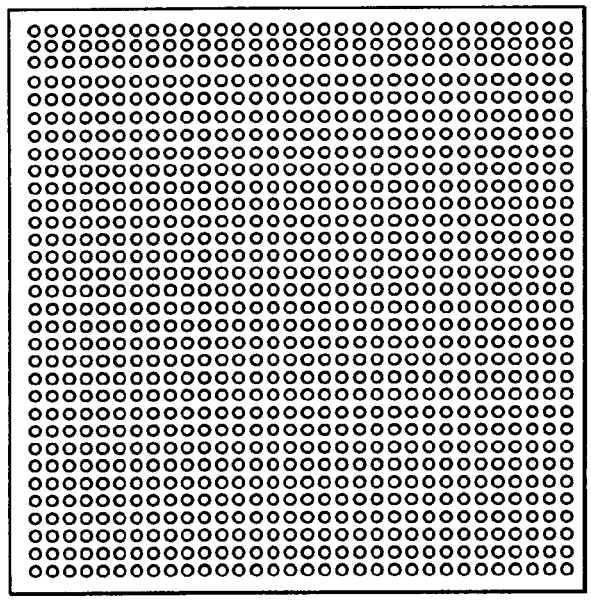
FIG. 4 is an example background arrangement useful in gaining a more thorough understanding/appreciation of the present invention.

FIG. 4 shows a standard BGA field for a VIP situation. The substrate 18 as an array of 32×32 pads for receiving a package having a similar arrangement of solder balls. Each of these pads is a VIP pad and accordingly may have weaknesses as described above.

Figure 5:
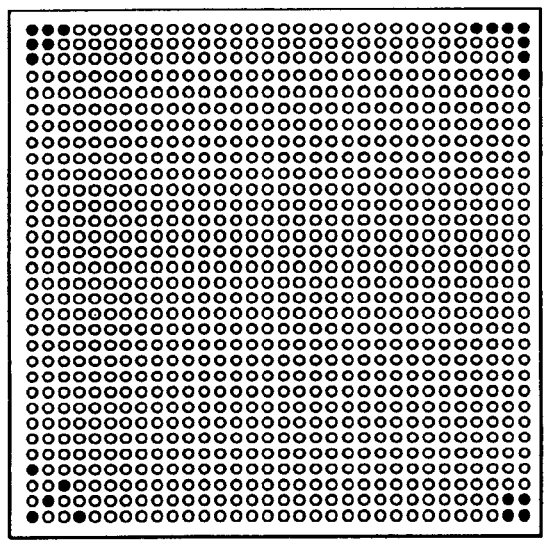
FIG. 5 is an example advantageous arrangement describing the present invention.

FIG. 5 shows a field which a similar to that shown in FIG. 4, except that some of the pads have been changed to standard arrangements rather than VIP arrangements. By having the standard pads at the highest stressed points, they withstand greater deflection before permanent damage renders them non-functional. Damage is less likely to occur at these points which are most susceptible to damage.

The standard joints shown in FIG. 5 occur at each of the 4 corners. The exact arrangement of the standard joints may vary, depending on which is most effective. The lower right hand corner of the FIG. shows an arrangement of four locations in a square. The upper right hand corner shows seven locations including the corner and three additional locations on each side of the corner. The upper left-hand corner shows six locations including the corner and two additional locations on each side, plus the location nearest the corner on a diagonal. Thus a triangle is formed by the six locations. The lower left-hand corner includes five locations. This includes the corner, one location on each side separated from the corner by three locations and two locations on the diagonal. Thus, a triangle with openings on the side are formed. Clearly, other arrangements of particular locations can be utilized. While these are generally at the corners and along the sides where the deflections and stresses are greatest, they can be placed anywhere in the array the highest stresses occur. These locations may differ for different packages and different arrangements of heat sinks, since the stresses will be located differently.

In concluding, reference in the specification to "one embodiment", "an embodiment", "example embodiment, etc." means that a particular feature, structure or characteristic described in connection with the embodiment is included in at least one embodiment of the invention. The appearances of such phrases in various parts of the specification are not necessarily all referring to the same embodiment. Further, when a particular feature, structure or characteristic is described in connection with any embodiment, it is submitted that is within the purview of one skilled in the art to effect such feature structure or characteristic in connection with other ones of the embodiments.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the components parts and/or arrangements of the subject combination arrangement within the scope of the foregoing disclosure, the drawings and the appended claims without departing from the spirit of the invention. In addition to variations and modifications in the component parts and/or arrangements, alternative uses will be apparent to those skilled the art.

The invention claimed is:

1. A device comprising:
a substrate having a first surface and a second surface;
a plurality of contact pads on the first surface adapted to electrically couple to a microelectronic package adjacent to the first surface, wherein the contact pads are substantially arranged in a grid pattern;
wherein a first group of the plurality of contact pads are laterally separated from corresponding vias and a second group of the plurality of contact pads contain a corresponding via; and
wherein the grid pattern contains an interior section that includes at least about half of the contact pads and is substantially free from contact pads of the first group of contact pads and a perimeter section that includes corners of the grid pattern and includes the first group of the plurality of contact pads;
wherein the first group of contact pads are arranged in a triangle near each corner of the grid pattern and substantially no pads of the first group of contact pads are located outside one of the triangles.

2. A device comprising:
a substrate having a first surface and a second surface;
a plurality of contact pads on the first surface adapted to electrically couple to a microelectronic package adjacent to the first surface, wherein the contact pads are substantially arranged in a grid pattern;
wherein a first group of the plurality of contact pads are laterally separated from corresponding vias and a second group of the plurality of contact pads contain a corresponding via; and
wherein the grid pattern contains an interior section that includes at least about half of the contact pads and is substantially free from contact pads of the first group of contact pads and a perimeter section that includes corners of the grid pattern and includes the first group of the plurality of contact pads;

wherein the first group of contact pads are arranged in a rectangular shape near each corner of the grid pattern and substantially no pads of the first group of contact pads are located outside one of the rectangular shapes.

3. A device comprising:

a substrate having a first surface and a second surface;

a plurality of contact pads on the first surface adapted to electrically couple to a microelectronic package adjacent to the first surface, wherein the contact pads are substantially arranged in a grid pattern;

wherein a first group of the plurality of contact pads are laterally separated from corresponding vias and a second group of the plurality of contact pads contain a corresponding via; and wherein the grid pattern contains an interior section that includes at least about half of the contact pads and is substantially free from contact pads of the first group of contact pads and a perimeter section that includes corners of the grid pattern and includes the first group of the plurality of contact pads;

wherein the first group of contact pads are arranged to have a highest density relative to the second group of contact pads near each corner of the grid pattern.

* * * * *